(12) United States Patent
White

(10) Patent No.: US 7,233,179 B2
(45) Date of Patent: Jun. 19, 2007

(54) OUTPUT STAGE INTERFACE CIRCUIT FOR OUTPUTTING DIGITAL DATA ONTO A DATA BUS

(75) Inventor: Liam Joseph White, Patrickswell (IE)

(73) Assignee: Analog Devices, Inc., Norwood, MA (US)

( * ) Notice: Subject to any disclaimer, the term of this patent is extended or adjusted under 35 U.S.C. 154(b) by 3 days.

(21) Appl. No.: 11/262,224

(22) Filed: Oct. 28, 2005

(65) Prior Publication Data

US 2007/0096780 A1    May 3, 2007

(51) Int. Cl.
H03B 1/00    (2006.01)
(52) U.S. Cl. .................... 327/112; 327/382; 327/534
(58) Field of Classification Search ............... 327/112, 327/382, 534; 326/86
See application file for complete search history.

(56) References Cited

U.S. PATENT DOCUMENTS

| | | | | |
|---|---|---|---|---|
| 5,113,096 | A * | 5/1992 | Lev et al. ..................... | 326/84 |
| 5,414,314 | A | 5/1995 | Thurber, Jr. ................. | 327/427 |
| 5,592,142 | A | 1/1997 | Adams et al. ............ | 340/146.2 |
| 5,804,861 | A | 9/1998 | Leach ......................... | 257/362 |
| 5,966,041 | A | 10/1999 | Moane ........................ | 327/417 |
| 5,996,041 | A | 11/1999 | Kim ............................ | 327/432 |
| 6,525,594 | B2 * | 2/2003 | Fugate et al. ............... | 327/534 |
| 6,646,490 | B1 | 11/2003 | Braun ......................... | 327/432 |

* cited by examiner

Primary Examiner—Linh My Nguyen
Assistant Examiner—Ryan C. Jager
(74) Attorney, Agent, or Firm—Wolf, Greenfield & Sacks, P.C.

(57) ABSTRACT

An output stage interface circuit (1) comprises a main bipolar transistor (Q1) coupling a data output terminal (5) to a first rail (2) to which the positive of the power supply voltage ($V_{DD}$) is applied, and a substrate diffusion isolated main NMOS transistor (MN1) coupling the data output terminal (5) to a second rail (3) which is held at ground. Control signals from a data control circuit (6) selectively operate the main bipolar transistor (Q1) and the main MOS transistor (MN1) for determining the logic high and low states of the data output terminal (5) during data output. A back gate (23) of the main MOS transistor (MN1) is independently configurable, and is selectively and alternately coupleable to one of the second rail (3) and the data output terminal (5) in response to the voltage on the data output terminal (5), so that when the voltage on the data output terminal (5) is pulled below a voltage reference ($V_{REF}$), the back gate (23) is coupled to the data output terminal (5) for preventing a parasitic bipolar transistor ($Q_{p1}$) and a parasitic diode ($D_{p2}$) of the main MOS transistor (MN1) sourcing current to the data bus. First and second primary buffer circuits (11) and (14) are coupled between the first rail (2) and the back gate (23) of the main MOS transistor (MN1), so that when the voltage on the data output terminal (5) is pulled below the voltage reference ($V_{REF}$), the base (13) and the gate (10) of the main bipolar transistor (Q1) and the main MOS transistor (MN1) can be pulled to the voltage on the data output terminal (5) for maintaining the main bipolar transistor (Q1) and the main MOS transistor (MN1) in the off-state.

29 Claims, 5 Drawing Sheets

Table
Operating conditions of the interface circuit 1

| Condition | State of the 1st, 2nd & 3rd signals | Operating state of the interface circuit on lines 8 and 9 | State of voltage on data output terminal | Impedance presented by interface circuit |
|---|---|---|---|---|
| (1) | $V_{DD}$ applied<br>Line 8 = 0<br>Line 9 = 0 | Voltage above $V_{DD}$<br>Q1 - off<br>MN1 - off | High impedance | |
| (2) | Line 8 = 0<br>Line 9 = 0 | $V_{DD}$ applied<br>Q1 - off<br>MN1 - off | Voltage below ground | High impedance |
| (3) | Line 8 = 0<br>Line 9 = 0 | $V_{DD}$ = 0 volts<br>Q1 - off<br>MN1 - off | Voltage above $V_{DD}$ | High impedance |
| (4) | Line 8 = 0<br>Line 9 = 0 | $V_{DD}$ = 0 volts<br>Q1 - off<br>MN1 - off | Voltage below ground | High impedance |

Fig. 5 ly low voltages, for example, laptop computers operate with a supply voltage of 5 volts, and may operate with supply voltages as low as 3 volts. Indeed, the majority of CMOS circuits operate at supply voltages as low as 3 volts. Accordingly, interface circuits for interfacing an output stage to a data bus operating within the RS485 transmission standard or other transmission standards which permit a relatively wide voltage range must be capable of presenting a high impedance to the data bus over at least the permitted voltage range of the data bus, in order to avoid currents being sourced to the data bus from the interface circuit or vice versa.

OUTPUT STAGE INTERFACE CIRCUIT FOR OUTPUTTING DIGITAL DATA ONTO A DATA BUS

FIELD OF THE INVENTION

The present invention relates to an output stage interface circuit for interfacing the output stage with a data bus for outputting digital data onto the data bus.

BACKGROUND TO THE INVENTION

Interface circuits for interfacing an output stage of digital data processing devices with a data bus, and in particular with a shared data bus, for outputting digital data onto the data bus are known. Such interface circuits must comply with the operating transmission standard of the data bus. Such transmission standards are, for example, RS485, RS422, RS232 and CANbus standards. Such standards permit the voltage on the data bus to vary within relatively wide voltage ranges. For example, the RS485 standard permits the voltage on the data bus to vary between +12 volts and −7 volts. Indeed, some transmission standards permit operation of a data bus within voltage ranges wider than the permitted voltage range of the RS485 standard. Many data processing devices operate at relative- Additionally, the RS485 transmission standard and other transmission standards require that a data output signal produced by an interface circuit for applying to the data bus be produced with a relatively high voltage swing between the logic high level and the logic low level. For example, the RS485 standard requires that the data output signal deliver a differential output voltage of 1.5 volts across a differential load resistor of 54 ohms. Accordingly, low voltage circuits, for example, CMOS output stage interface circuits operating with a 3 volt supply require that the on-resistance of driver transistors which drive the data output terminal of such interface circuits to the logic high and logic low voltage levels be relatively low, in order to provide the necessary output voltage swing. This requires that the die area of the driver transistors be sufficient to produce the appropriate relatively low on-resistance.

A typical elementary prior art output stage interface circuit, which is implemented by a CMOS process is illustrated in FIG. 1, and is indicated generally by the reference numeral 100. Power supply rails, namely, a first rail 101, and a second rail 102 receive a power supply, typically a 3 volt power supply $V_{DD}$. The second rail 102 is held at ground, and the positive supply voltage $V_{DD}$ is applied to the first rail 101. Digital data is outputted onto a data bus (not shown) through a data output terminal 103. A PMOS transistor 105 couples the data output terminal 103 to the first rail 101, and an NMOS transistor 106 couples the data output terminal 103 to the second rail 102. A data control circuit 107 in response to digital data inputted from a digital data processing device (not shown) outputs control signals to gates of the respective PMOS and NMOS transistors 105 and 106 for selectively operating the transistors 105 and 106 for determining the logic high and logic low voltage states of the data output terminal 103, for in turn outputting the data in digital form onto the data bus, and also for simultaneously disabling the PMOS and NMOS transistors 105 and 106, in other words, for simultaneously holding the transistors 105 and 106 in the off-state during periods when data is not being outputted to the data bus.

In this specification the terms "on-state" and "off-state" when used in conjunction with a transistor are used to refer to the low impedance state and the high impedance state, respectively, of the transistor.

However, a problem with the prior art interface circuit 100 occurs when the voltage on the data output terminal 103 is pulled by the voltage on the data bus to a voltage above the supply voltage $V_{DD}$ on the first rail 101, or below ground voltage on the second rail 102. Once the voltage on the data output terminal 103 is pulled by the voltage on the data bus above the supply voltage $V_{DD}$ on the first rail 101 by approximately 0.7 volts, a parasitic diode $D_{p1}$ between the back gate and the drain of the PMOS transistor 105 becomes sufficiently forward biased to conduct, and thus current is sourced from the data bus to the interface circuit. Additionally, when the voltage on the data output terminal 103 is pulled by the voltage on the data bus to a voltage of approximately −0.7 volts below the ground voltage on the second rail 102, a parasitic diode $D_{p2}$ between the back gate and the drain of the NMOS transistor 106 becomes sufficiently forward biased to conduct, and thus current is sourced from the interface circuit to the data bus. Neither of these conditions is permissible.

Output stage interface circuits which have overcome the problem of sourcing current to and from the data bus are disclosed in U.S. Pat. No. 5,966,041 of Brian Moane, and in U.S. Pat. No. 5,414,314 of Charles Thurber. However, in the interface circuit disclosed in U.S. Pat. No. 5,966,041 of Moane, two NMOS transistors coupled in series between the data output terminal and the ground rail determine the logic low voltage state of the output terminal. The two NMOS transistors are arranged in order to prevent current being sourced from the interface circuit to the data bus, when the voltage on the data bus drops below the ground voltage on the ground rail. The disadvantage of providing two MOS transistors in series is that the on-resistance of the two MOS transistors must each be half the on-resistance of a single MOS transistor in order that the output terminal can be driven with the same output voltage swing as with a single MOS transistor. However, in order to halve the on-resistance of a MOS transistor, the size of the MOS transistor must be doubled. Thus, the die area required by the two NMOS transistors is four times that which would be required by the NMOS transistor 106 of the prior art interface circuit 100.

The interface circuit disclosed in U.S. Pat. No. 5,414,314 of Thurber also requires two NMOS transistors to be coupled in series between the data output terminal and the ground rail, and also requires two PMOS transistors to be coupled between the data output terminal and the high voltage rail of the supply voltage. Accordingly, the die area required by the interface circuit of Thurber is four times that which would be required for the prior art interface circuit 100.

With the premium being currently placed on die area in most integrated circuits, and in particular, in CMOS circuits, the quadrupling of the die area required by the two MOS transistors which couple the data output terminal to the ground rail of the integrated circuit of Moane, and the quadrupling of the die area required by the interface circuit of Thurber is undesirable. There is therefore a need for an output stage interface circuit which addresses this problem.

The present invention is directed towards providing such an output stage interface circuit.

SUMMARY OF THE INVENTION

According to the invention there is provided an output stage interface circuit for interfacing with a data bus, the interface circuit comprising:

a first switch element coupled between a first rail and a data output terminal, the first rail being adapted for coupling to one of a high and a low voltage of a power supply, and the data output terminal being adapted for coupling to the data bus, the first switch element being responsive to a first control signal for selectively coupling the data output terminal to the first rail for determining one of a logic high state and a logic low state of the data output terminal during data output, a second switch element coupled between a second rail and the data output terminal, the second rail being adapted for coupling to the other of the high and the low voltage of the power supply, the second switch element comprising a main MOS device having a gate for receiving a second control signal and being responsive to the second control signal for selectively coupling the data output terminal to the second rail for determining the other of the logic high state and the logic low state of the data output terminal during data output, the main MOS device having an independently configurable back gate selectively and alternately coupleable to one of the second rail and the data output terminal, the back gate of the main MOS device being coupled to the second rail in response to the voltage on the data output terminal being in a first state, and being coupled to the data output terminal in response to the voltage on the data output terminal being pulled by the voltage on the data bus to a second state from the first state across a voltage reference to lie to a side of the voltage reference opposite to that to which the voltage on the first rail lies for preventing current being conducted through parasitic components in the main MOS device coupled through the main MOS device to the data output terminal, thereby preventing current being sourced from one of the interface circuit and the data bus to the other of the interface circuit and the data bus through the said parasitic components in the main MOS device, and the gate of the main MOS device being coupleable to the data output terminal in response to the voltage on the data output terminal being pulled to the second state.

Preferably, the value of the voltage reference is selected to be close to the voltage on the second rail.

Preferably, the value of the voltage reference is selected so that the value of the voltage difference between the voltage reference and the voltage on the second rail is less than a value which if applied to the parasitic components in the main MOS device which are coupled to the data output terminal would be sufficient to forward bias the said parasitic components into a low impedance state.

Advantageously, the value of the voltage reference is selected to lie within 0.3 volts from the voltage on the second rail.

In one embodiment of the invention the value of the voltage reference is selected to be of a value which lies outside the operating voltage range defined by the power supply applied to the first and second rails and lies to the side of the operating voltage range adjacent the voltage on the second rail.

In one embodiment of the invention a control switch unit responsive to the state of the voltage on the data output terminal is provided for selectively and alternately coupling the back gate of the main MOS device to one of the second rail and the data output terminal.

In another embodiment of the invention the control switch unit comprises a first control switch coupled between the back gate and the data output terminal, and a second control switch coupled between the back gate and the second rail, the first and second control switches being responsive to the state of the voltage on the data output terminal.

Preferably, the first and second control switches are provided by first and second MOS devices, respectively, each comprising an independently configurable back gate, and the back gate of each of the first and second MOS devices being coupled to one of the source and drain of the corresponding one of the first and second MOS devices for preventing parasitic components in the respective first and second MOS devices being sufficiently forward biased to conduct when the voltage on the data output terminal is pulled to the second state.

In one aspect of the invention the second control signal is coupled to the gate of the main MOS device through a first primary buffer circuit, the first primary buffer circuit being selectively and alternately coupleable between the first rail and the second rail, and the first rail and the data output terminal for powering thereof, in response to the voltage on the data output terminal, and being coupled between the first rail and the data output terminal in response to the voltage on the data output terminal being in the second state.

Preferably, the first primary buffer circuit comprises a first primary buffer MOS device for selectively coupling the gate of the main MOS device to the data output terminal, the first primary buffer MOS device having an independently configurable back gate coupled to one of a source and a drain of the first primary buffer MOS device for preventing parasitic components in the first primary buffer MOS device being sufficiently forward biased to conduct when the voltage on the data output terminal is pulled to the second state, and advantageously, the first primary buffer circuit comprises a second primary buffer MOS device for selectively coupling the gate of the main MOS device to the first rail.

In another aspect of the invention the first switch element comprises a control terminal for receiving the first control signal, the control terminal thereof being coupleable to the data output terminal in response to the voltage on the data output terminal being pulled to the second state.

Preferably, the first control signal is coupled to the control terminal of the first switch element through a second primary buffer circuit, the second primary buffer circuit being selectively and alternately coupleable between the first rail and the second rail, and the first rail and the data output terminal for powering thereof, in response to the voltage on the data output terminal, and being coupled between the first rail and the data output terminal in response to the voltage on the data output terminal being in the second state.

Advantageously, the second primary buffer circuit comprises a third primary buffer MOS device for selectively coupling the control terminal of the first switch element to the data output terminal, the third primary buffer MOS device having an independently configurable back gate coupled to one of a source and drain of the third primary buffer MOS device for preventing parasitic components in the third primary buffer MOS device being sufficiently forward biased to conduct when the voltage on the data output terminal is pulled to the second state, and preferably, the second buffer circuit comprises a fourth primary buffer MOS device for selectively coupling the control terminal of the first switch element to the first rail.

In another aspect of the invention a data control circuit is provided for converting a digital data signal from a digital data processing circuit to the first and second control signals.

Preferably, the data control circuit is responsive to the voltage on the data output terminal being pulled to the second state for outputting a third control signal for coupling the control terminal of the first switch element and the gate of the main MOS device to the data output terminal.

In one embodiment of the invention a comparator is provided for comparing the voltage on the data output terminal with the voltage reference and for outputting a signal indicative of the state of the voltage on the data output terminal.

In one aspect of the invention the main MOS device is a substrate isolated MOS device.

Preferably, the main MOS device is diffusion isolated. Advantageously, a diffusion well is provided extending around the main MOS device for isolating the main MOS device from the substrate in which the main MOS device is formed, and a buried diffusion layer extends beneath the main MOS device and co-operates with the diffusion well for isolating the main MOS device from the substrate in which the main MOS device is formed.

Preferably, the diffusion well of the main MOS device is coupled to a voltage relative to the voltage on the second rail for preventing a parasitic diode between the diffusion well and the back gate being sufficiently forward biased to conduct current. Ideally, the diffusion well of the main MOS device is coupled to the first rail.

In another aspect of the invention the voltage of the power supply applied to the first rail is higher than the voltage of the power supply applied to the second rail, and the main MOS device is an NMOS transistor.

In a further aspect of the invention the first switch element comprises a main bipolar transistor.

In one embodiment of the invention the interface circuit is implemented as an integrated circuit.

In another embodiment of the invention the interface circuit is implemented by a BiCMOS process.

Additionally the invention provides a differential output stage interface circuit for interfacing with a differential data bus comprising a pair of interface circuits as claimed in claim 1, one of the interface circuits being adapted for receiving a digital data signal directly from a digital data processing circuit, and the other of the interface circuits being adapted to receive the data signal from the data processing circuit through an inverter for inverting thereof, the output terminals of the respective interface circuits being adapted for coupling to respective differential lines of the differential bus.

In one embodiment of the invention the interface circuit is adapted for interfacing with a data bus operating under the RS485 transmission standard.

ADVANTAGES OF THE INVENTION

The advantages of the invention are many. The interface circuit according to the invention is particularly suitable for low voltage applications, and for interfacing with shared data buses, which operate within transmission standards which permit the voltage on the data bus to vary within relatively wide voltage ranges, and in particular, voltage ranges which are greater than the operating voltage of the interface circuit. A particularly important advantage of the invention is that the die area required for the interface circuit according to the invention is minimised. This is achieved by virtue of the fact that the second switch element for coupling the data output terminal to the second rail is provided by only one MOS device, and accordingly, the die area required for the second switch element is quarter of that required for a corresponding switch circuit of known prior art interface circuits which require two transistors coupled in series.

The provision of the second switch element as a single MOS device is possible by virtue of the fact that the back gate of the single MOS device, namely, the main MOS device is independently configurable. By virtue of the fact that the back gate of the main MOS device is independently configurable, the voltage on the back gate of the main MOS device can be controlled independently of the voltage at which the substrate in which the main MOS device is formed is held. This, thus, permits the back gate of the main MOS device to be coupled to the data output terminal in the event of the voltage on the data output terminal being pulled by the voltage on the data bus to the second state, so that the voltage on the back gate of the main MOS device substantially follows the voltage on the data output terminal while the voltage on the data output terminal is in the second state. By virtue of the fact that the voltage on the back gate of the main MOS device substantially follows the voltage on the data output terminal while the voltage thereon is in the second state, parasitic components in the main MOS device, which are coupled through the main MOS device to the data output terminal are prevented from being sufficiently forward biased to conduct current, and thus are prevented from sourcing current from the interface circuit to the data bus, or from the data bus to the interface circuit, depending on whether the low or the high voltage of the power supply is applied to the second rail. Typically, the substrate in which the main MOS device is formed is held at one of the high and the low voltage of the power supply. Therefore, by virtue of the fact that the back gate of the main MOS device is independently configurable relative to the substrate, the back gate can be coupled to the data output terminal when the voltage on the data output terminal is pulled by the data bus to the second state, without any danger of current being sourced from the substrate through the back gate to the data bus, or vice versa, depending on whether the low or the high voltage of the power supply is applied to the second rail.

By coupling the first primary buffer circuit between the first rail and the data output terminal, the gate of the main MOS device can be held at the voltage on the data output terminal when the voltage on the data output terminal is in the second state, so that the voltage on the gate of the main MOS device follows the voltage on the data output terminal, thereby permitting the main MOS device to be held in the off-state while the voltage on the data output terminal is in the second state. This, thus, prevents currents being sourced from one of the interface circuit and the data bus to the other of the interface circuit and the data bus through the main MOS device when the voltage on the data output terminal is in the second state, depending on whether the low or high voltage of the power supply is applied to the second rail. Additionally, by coupling the second primary buffer circuit between the first rail and the back gate of the main MOS device, the control terminal of the first switch element can be held at the voltage on the data output terminal when the voltage on the data output terminal is in the second state, so that the voltage on the control terminal of the first switch element follows the voltage on the data output terminal, thereby permitting the first switch element to be held in the off-state while the voltage on the data output terminal is in the second state. This, thus, prevents current being sourced from one of the interface circuit and the data bus to the other of the interface circuit and the data bus when the voltage on the data output terminal is in the second state, depending on which of the low and high voltage of the power supply is applied to the second rail.

The invention and its many advantages will become readily apparent from the following description of some preferred embodiments thereof, which are given by way of example only, with reference to the accompanying drawings.

BRIEF DESCRIPTION OF THE DRAWINGS

FIG. 5 is a table setting out the impedance presented by the output stage interface circuit of FIG. 2 to a data bus for different operating conditions of the output stage interface circuit.

DETAILED DESCRIPTION OF SOME PREFERRED EMBODIMENTS OF THE INVENTION

Figure 2:
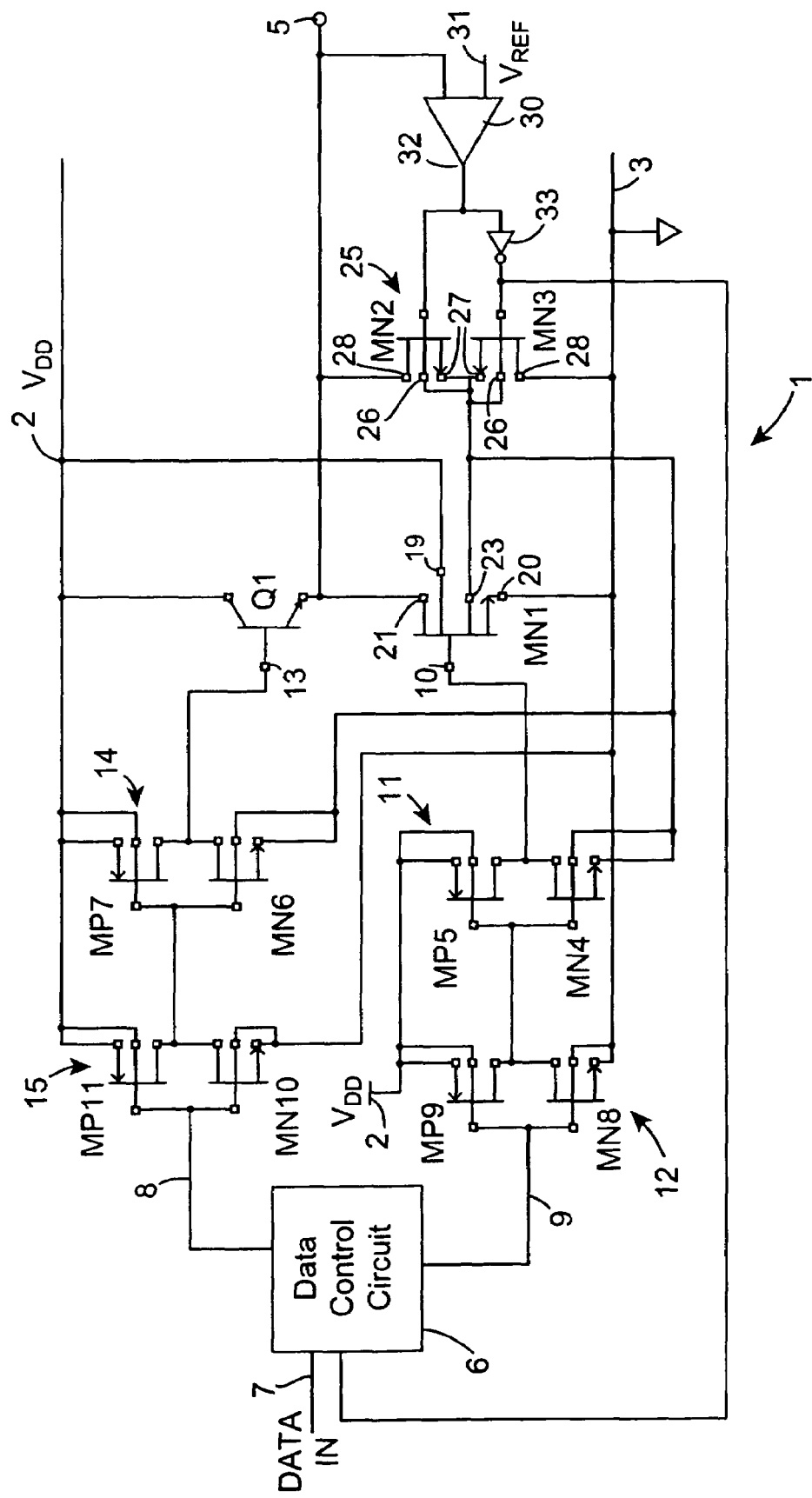
FIG. 2 is a circuit diagram of an output stage interface circuit according to the invention.
Figure 3:
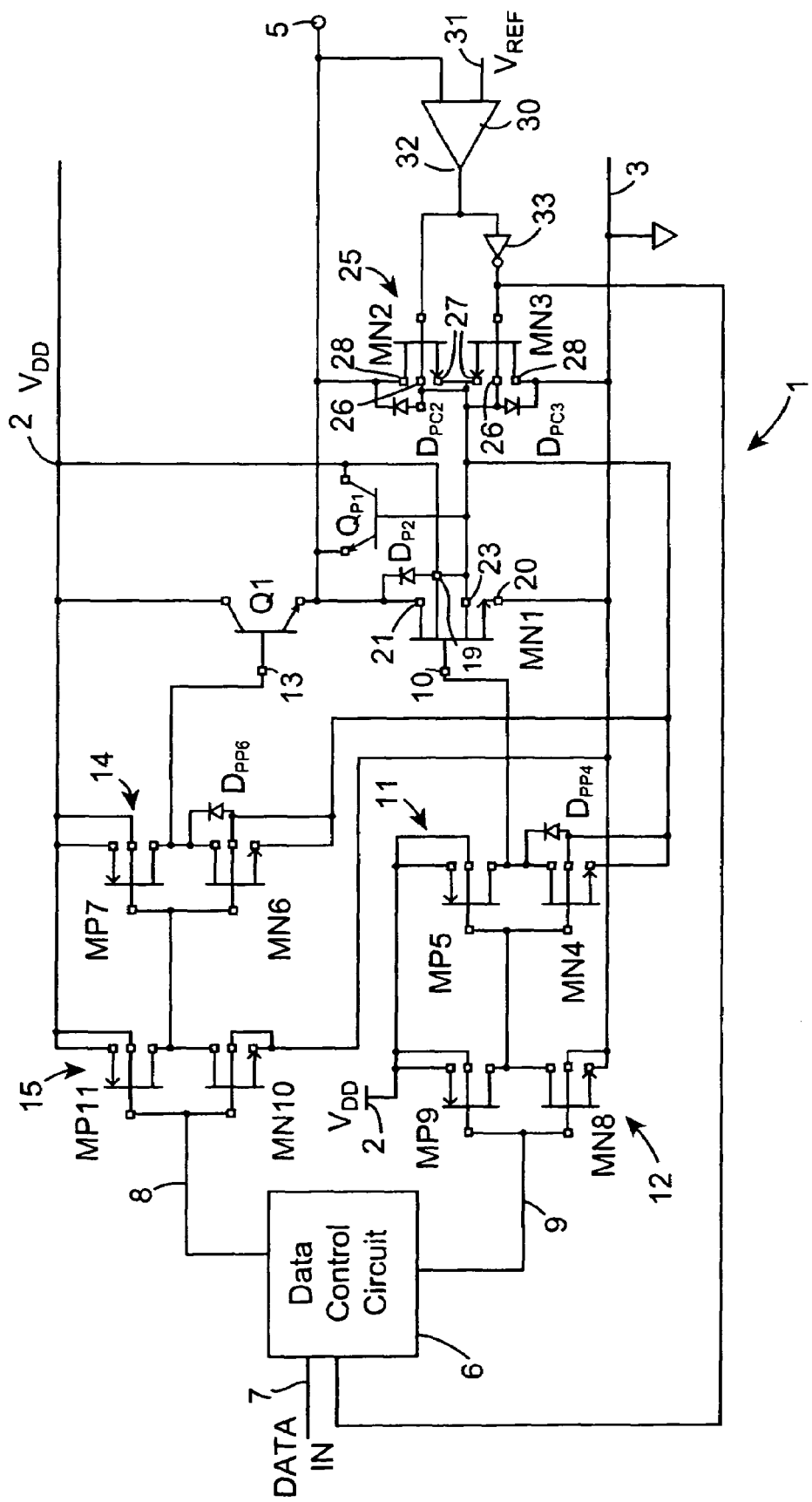
FIG. 3 is a circuit diagram of the output stage interface circuit of FIG. 2 illustrating some parasitic components of MOS devices in the interface circuit.

Referring to the drawings and initially to FIGS. 2 and 3 thereof, there is illustrated an output stage interface circuit according to the invention, indicated generally by the reference numeral 1, for interfacing a digital data processing device (not shown) with a shared data bus (also not shown) for outputting digital data from the data processing device onto the data bus. The data bus typically would be a shared data bus which would operate to a transmission standard, which permitted a relatively wide operating voltage range, typically, down to at least −7 volts, and up to at least +12 volts. The data processing device may be any type of data processing device, for example, a computer, in particular a laptop computer, or any other such digital data processing device or circuit, which in particular, is of the type which operates with relatively low voltage power supply, typically, a +3 volts power supply. In this embodiment of the invention the interface circuit 1 is implemented as an integrated circuit in a BiCMOS process, and is operable with a +3 volt power supply, and presents a high impedance to the data bus when the voltage on the data bus falls below or exceeds the power supply voltage. The interface circuit 1 comprises first and second power supply rails 2 and 3, respectively across which the supply voltage is applied. The second rail 3 is a ground rail and is held at ground of the supply voltage, while the positive supply voltage $V_{DD}$ of approximately +3 volts is applied to the first rail 2. A digital data output terminal 5 is provided from the interface circuit 1 for coupling to the data bus (not shown) for applying the digital data to the data bus.

A first switch element, namely, a first driver transistor provided by a main bipolar transistor Q1, which in this case is an NPN bipolar transistor, is coupled between the first rail 2 and the data output terminal 5. The main bipolar transistor Q1 is responsive to a first control signal from a data control circuit 6 for selectively pulling the data output terminal 5 to a logic high voltage state during data output to the data bus, as will be described below. A second switch element, namely, a second driver transistor provided by a main MOS device, namely, a main MOS transistor MN1, which in this case is a substrate diffusion isolated NMOS field effect transistor, is coupled between the second rail 3 and the data output terminal 5. The main MOS transistor MN1 is responsive to a second control signal from the data control circuit 6 for selectively pulling the data output terminal 5 to a logic low voltage state during data output to the data bus, as will also be described below. The main bipolar transistor Q1 and the main MOS transistor MN1 are both responsive to a third control signal from the data control circuit 6 for operating in the off-state during periods of no data output.

The data control circuit 6 receives digital data from the data processing circuit (not shown) on a data input 7, and converts the digital data to the first and second control signals, which are outputted to the main bipolar transistor Q1 and the main MOS transistor MN1 on first and second control lines 8 and 9, respectively. A gate 10 of the main MOS transistor MN1 is coupled to the second control line 9 through a first primary buffer circuit 11 and a first secondary buffer circuit 12, while a control terminal, namely, a base 13 of the main bipolar transistor Q1 is coupled to the first control line 8 through a second primary buffer circuit 14 and a second secondary buffer circuit 15. The third signal for simultaneously operating the main bipolar transistor Q1 and the main MOS transistor MN1 in the off-state is supplied by the data control circuit 6 to the first and second control lines 8 and 9, and in turn to the base 13 of the main bipolar transistor Q1 and the gate 10 of the main MOS transistor MN1 through the second and first primary and secondary buffer circuits 14, 15, 11 and 12, respectively. The first primary and secondary buffer circuits 11 and 12, and the second primary and secondary buffer circuits 14 and 15 will be described in detail below.

Figure 4:
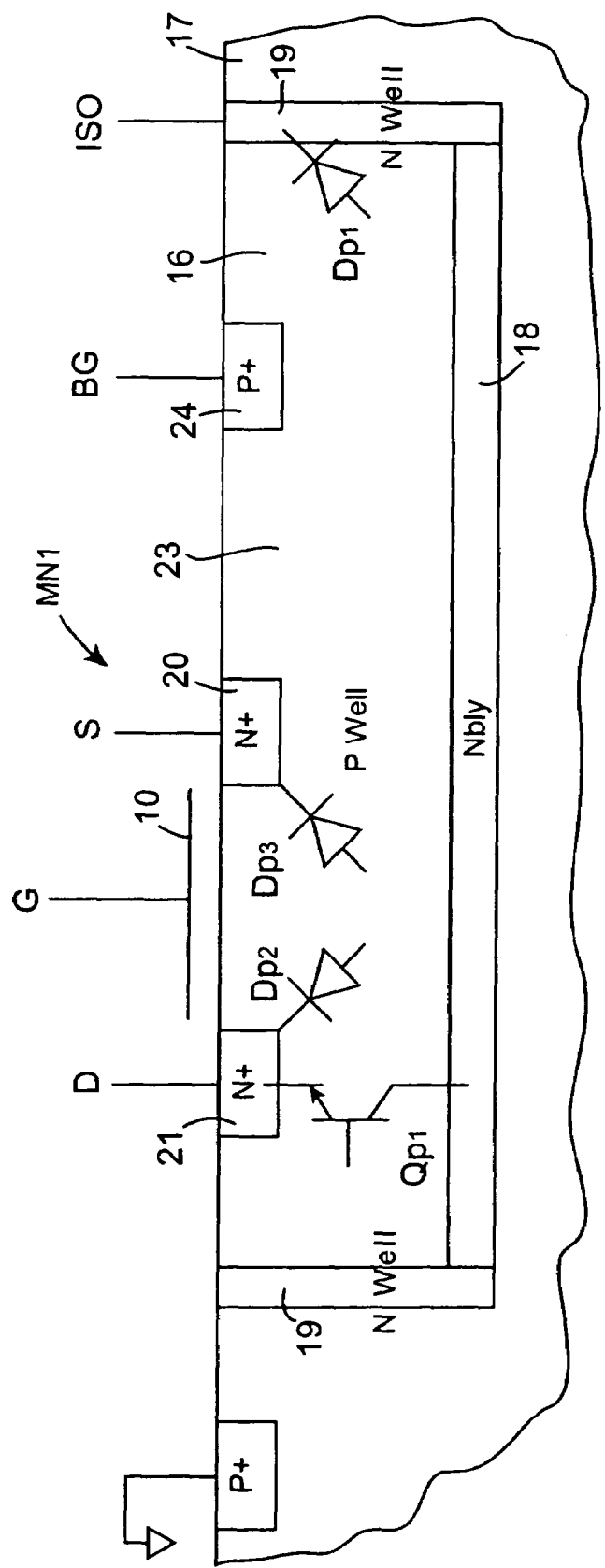
FIG. 4 is a transverse cross-sectional side elevational view of a MOS device of the output stage interface circuit of FIG. 2.

Before describing the interface circuit 1 in further detail, the main MOS transistor MN1 will first be described with reference to FIG. 4. The main MOS transistor MN1 is formed in a P-well 16, and being a substrate diffusion isolated MOS device, the P-well 16 is isolated from a P-substrate 17, in which the main MOS transistor MN1 is formed, by a buried N diffusion layer 18 which is located beneath the P-well 16, and an N diffusion N-well 19, which extends completely around the P-well 16. The N-well 19 and the buried diffusion layer 18 co-operate electrically for isolating the P-well 16 from the P-substrate 17. N+ diffusions in the P-well 16 form a source 20 and a drain 21 of the main MOS transistor MN1. The gate 10 of the main MOS transistor MN1 is located between the N+ diffusions, which form the source 20 and drain 21 of the main MOS transistor MN1. The P-well 16 forms a back gate 23 of the main MOS transistor MN1, and a P+ diffusion 24 in the P-well 16 facilitates coupling the back gate 23 or P-well 16 to the interface circuit 1. Since the P-well 16 or back gate 23 of the main MOS transistor MN1 is isolated from the P-substrate 17, the back gate 23 is independently configurable relative to the P-substrate 17, and thus, can be held at a voltage independent of the voltage of the P-substrate 17. In this case the P-substrate 17 is held at the ground voltage on the second rail 3. Electrically conductive contact pads (not shown) are provided in contact with the source 20, the drain 21, the gate 10, the back gate 23 and the N-well 19 for facilitating electrically connecting the main MOS transistor MN1 into the interface circuit 1. The provision of such contact pads will be well known to those skilled in the art. The main MOS transistor MN1 is coupled between the second rail 3 and the data output terminal 5 with the source 20 coupled to the second rail 3, and the drain 21 coupled to the data output terminal 5.

Parasitic diodes $D_{p1}$, $D_{p2}$ and $D_{p3}$ exist between the P-well 16 and the N-well 19, the P-well 16 and the drain 21, and the P-well 16 and the source 20, respectively, in the main MOS transistor MN1. A parasitic bipolar transistor $Q_{p1}$ exists in the main MOS transistor MN1 between the drain 21 and the buried diffusion layer 18, with the N+ diffusion of the drain 21 forming the emitter of the parasitic bipolar transistor $Q_{p1}$, the buried diffusion layer 18 forming the collector and the P-well 16 forming the base thereof. Other parasitic components are present in the main MOS transistor as will be understood by those skilled in the art. However, for the purpose of the present invention the parasitic diodes $D_{p1}$ and $D_{p2}$ and the parasitic bipolar transistor $Q_{p1}$ are of most relevance. The N-well 19 of the main MOS transistor MN1 is coupled to the first rail 2 for holding the N-well 19 and the buried diffusion layer 18 at the supply voltage $V_{DD}$, so that the N-well 19 and the buried diffusion layer 18 are held at a voltage above the back gate 23, in order to avoid the parasitic diode $D_{p1}$ becoming forward biased. The parasitic diode $D_{p2}$ and the parasitic bipolar transistor $Q_{p1}$ are coupled through the drain of the main MOS transistor MN1 to the data output terminal 5, see FIG. 3. Thus, if the voltage on the data output terminal 5 were pulled by the data bus to a voltage below the voltage on the back gate 23 by an amount to sufficiently forward bias the parasitic diode $D_{p2}$ and the parasitic bipolar transistor $Q_{p1}$ into the low impedance state, the parasitic diode $D_{p2}$ would source current from the back gate 23 to the data bus, and the parasitic bipolar transistor $Q_{p1}$ would source current from the first rail 2 through the N-well 19 and the buried diffusion layer 18 to the data bus. The parasitic diode $D_{p3}$ remains reversed biased when the voltage on the data output terminal 5 is pulled below the voltage on the back gate 23, and thus is not an issue.

In order to avoid current being sourced through the parasitic diode $D_{p2}$ and the parasitic bipolar transistor $Q_{p1}$, the back gate 23 of the main MOS transistor MN1 is selectively and alternately coupleable to the second rail 3 and the data output terminal 5 by a control switch unit 25, in response to the voltage on the data output terminal 5. The control switch unit 25 is responsive to the voltage on the data output terminal 5 being in a first state, namely, above a voltage reference $V_{REF}$, which is approximately −0.3 volts, for coupling the back gate 23 of the main MOS transistor MN1 to the second rail 3 for normal operation of the interface circuit 1. The control switch unit 25 is responsive to the voltage on the data output terminal 5 being in a second state, namely, below the voltage reference $V_{REF}$, for coupling the back gate 23 of the main MOS transistor MN1 to the data output terminal 5, thereby preventing the parasitic diode $D_{p2}$ and the parasitic bipolar transistor $Q_{p1}$ from being sufficiently forward biased to source current from the interface circuit 1 to the data bus, when the voltage on the data output terminal 5 is in the second state. The control switch unit 25 comprises a pair of control transistors, namely, a first control NMOS transistor MN2 and a second control NMOS transistor MN3. The back gate 23 of the main MOS transistor MN1 is selectively coupled to the data output terminal 5 through the first control transistor MN2, and is selectively coupled to the second rail 3 through the second control transistor MN3.

In this embodiment of the invention the value of the voltage reference $V_{REF}$, being selected to be approximately −0.3 volts is 0.3 volts below ground on the second rail 3. This is less than the forward biasing voltage required to operate the parasitic diode $D_{p2}$ and the parasitic bipolar transistor $Q_{p1}$ into the low impedance state. Thus, while the voltage on the data output terminal 5 is above ground, the parasitic diode $D_{p2}$ and the base-emitter of the parasitic bipolar transistor $Q_{p1}$ will be reversed biased, and thus will not conduct current. While the voltage on the data output terminal 5 is between ground and the voltage reference $V_{REF}$, the parasitic diode $D_{p2}$ and the base-emitter of the parasitic bipolar transistor $Q_{p1}$ will be insufficiently forward biased for either to conduct current. Once the voltage on the data output terminal 5 is pulled below the voltage reference $V_{REF}$, the voltage on the back gate 23 follows the voltage on the data output terminal 5, thereby preventing the parasitic diode $D_{p2}$ and the base-emitter of the parasitic bipolar transistor $Q_{p1}$ from being forward biased. Thus, the parasitic diode $D_{p2}$ and the parasitic bipolar transistor $Q_{p1}$ present a high impedance to the data bus.

Additionally, the value of the voltage reference $V_{REF}$ at −0.3 volts is sufficiently below ground to avoid any danger of the back gate 23 of the main MOS transistor MN1 being inadvertently coupled to the data output terminal 5 while the voltage on the data output terminal 5 is above ground, which could otherwise arise due to BiCMOS process faults or variations.

A comparator 30 compares the voltage on the data output terminal 5 with the voltage reference $V_{REF}$, which is applied to a voltage reference terminal 31, and the comparator 30 outputs an output signal on an output 32, which is indicative of the state of the voltage on the data output terminal 5 relative to the voltage reference $V_{REF}$. The output signal from the output 32 of the comparator 30 is applied directly to the gate of the first control transistor MN2, and is applied through an inverter 33 to the gate of the second control transistor MN3, so that when the voltage on the data output terminal 5 is pulled by the voltage on the data bus to the second state, namely, below the voltage reference $V_{REF}$, the first control transistor MN2 is held in the on-state, and the second control transistor MN3 is held in the off-state, thereby decoupling the back gate 23 of the main MOS transistor MN1 from the second rail 3, and coupling the back gate 23 to the data output terminal 5. When the voltage on the data output terminal 5 is in the first state, namely, above the voltage reference $V_{REF}$, the output signal from the comparator 30 holds the first control transistor MN2 in the off-state, and the second control transistor MN3 in the on-state for decoupling the back gate 23 of the main MOS transistor MN1 from the data output terminal 5, and coupling the back gate 23 to the second rail 3 for facilitating normal operation of the interface circuit 1.

In this embodiment of the invention the first and second control transistors MN2 and MN3 are substrate diffusion isolated MOS transistors, and the back gates 26 thereof are independently configurable. The back gate 26 of the first control transistor MN2 is connected to the source 27 thereof, in order to avoid a parasitic diode (not shown) between the back gate 26 and the source 27 thereof being forward biased when the voltage on the data output terminal 5 is pulled to the second state, namely, below the voltage reference $V_{REF}$. A parasitic diode $D_{pc2}$ between the back gate 26 and the drain 28 of the first control transistor MN2 is reversed biased when the voltage on the data output terminal 5 is above ground on the second rail 3. When the voltage on the data output terminal 5 is between ground and the voltage reference $V_{REF}$, the parasitic diode $D_{pc2}$ is insufficiently forward biased to conduct, and when the voltage on the data output terminal 5 is in the second state, namely, below the voltage reference $V_{REF}$, the voltage across the parasitic diode $D_{pc2}$ is approximately zero, since the first control transistor MN2 couples the back gate 23 of the main MOS transistor MN1 to the data output terminal 5. Thus, the second control transistor MN2 presents a high impedance to the data bus when the voltage on the data output terminal 5 is pulled to the second state.

The back gate 26 of the second control transistor MN3 is connected to the source 27 of the second control transistor MN3, in order to avoid a parasitic diode (not shown) between the back gate 26 and the source 27 of the second control transistor MN3 being forward biased when the voltage on the data output terminal 5 is pulled to the second state, namely, below the voltage reference $V_{REF}$. A parasitic diode $D_{pc3}$ between the back gate 26 and the drain 28 of the second control transistor MN3 remains reverse biased when the voltage on the data output terminal 5 is in the second state. When the voltage on the data output terminal 5 is above the voltage reference $V_{REF}$, the back gate 26 of the second control transistor MN3 is coupled to ground, as is the drain 28 of the second control transistor MN3 also coupled to ground, and thus, the voltage across the parasitic diode $D_{pc3}$ of the second control transistor MN3 is zero. Thus, the second control transistor MN3 presents a high impedance to the data output terminal 5 when the voltage on the data output terminal 5 is pulled to the second state.

The inverted output signal from the output 32 of the comparator 30 which is inverted by the inverter 33 is applied to the data control circuit 6. The data control circuit 6 is responsive to the inverted output signal from the comparator 30 being indicative of the voltage on the data output terminal 5 being pulled by the voltage on the data bus to the second state, namely, below the voltage reference $V_{REF}$ for outputting the third control signal on the first control line 8 and on the second control line 9 for simultaneously operating the main bipolar transistor Q1 and the main MOS transistor MN1 in the off-state, in order to prevent current being sourced from the interface circuit 1 through the main bipolar transistor Q1 and the main MOS transistor MN1 to the data bus.

The first primary buffer circuit 11 comprises first and second primary buffer MOS transistors, namely, a first primary buffer NMOS transistor MN4 and a second primary buffer PMOS transistor MP5, which are coupled in series between the first rail 2 and the back gate 23 of the main MOS transistor MN1. Thus, while the voltage on the data output terminal 5 is in the first state, namely, above the voltage reference $V_{REF}$, the first primary buffer circuit 11 is powered between the positive supply voltage $V_{DD}$ on the first rail 2 and the ground voltage on the second rail 3, and the voltage on the gate 10 of the main MOS transistor MN1 is selectively pulled between the supply voltage $V_{DD}$ on the first rail 2 and ground on the second rail 3 for switching the main MOS transistor MN1 between the on-state and the off-state in response to the second and third control signals during normal operation of the interface circuit 1. However, when the voltage on the data output terminal 5 is pulled by the voltage on the data bus to the second state, namely, below the voltage reference $V_{REF}$, the first primary buffer circuit 11 is powered between the supply voltage $V_{DD}$ on the first rail 2 and the voltage on the data output terminal 5. This permits the voltage on the gate 10 of the main MOS transistor MN1 to be pulled approximately to the voltage on the data output terminal 5 through the first primary buffer NMOS transistor MN4, in response to the third control signal on the second control line 9, when the voltage on the data output terminal 5 is pulled to the second state, so that the main MOS transistor MN1 can be held in the off-state, irrespective of how low the voltage on the data output terminal 5 is pulled below the voltage reference $V_{REF}$ by the voltage on the data bus.

The second primary buffer circuit 14 comprises third and fourth primary buffer MOS transistors, namely, a third primary buffer NMOS transistor MN6 and a fourth primary buffer PMOS transistor MP7, which are coupled in series between the first rail 2 and the back gate 23 of the main NMOS transistor MN1. Accordingly, when the voltage on the data output terminal 5 is in the first state, the second primary buffer circuit 14 is powered by the supply voltage on the first and second rails 2 and 3, and the voltage on the base 13 of the main bipolar transistor Q1 is selectively pulled between the voltage $V_{DD}$ on the first rail 2 and ground on the second rail 3 for switching the main bipolar transistor Q1 between the on-state and the off-state in response to the first and third control signals during normal operation of the interface circuit 1. However, when the voltage on the data output terminal 5 is pulled by the voltage on the data bus to the second state, the second primary buffer circuit 14 is powered between the supply voltage $V_{DD}$ on the first rail 2, and the voltage on the data output terminal 5. This, thus, permits the voltage on the base 13 of the main bipolar transistor Q1 to be pulled approximately to the voltage on the data output terminal 5 through the third primary buffer NMOS transistor MN6, in response to the third control signal on the first control line 8, when the voltage on the data output terminal 5 is pulled to the second state, so that the main bipolar transistor Q1 can be held in the off-state irrespective of how low the voltage on the data output terminal 5 is pulled below the voltage reference $V_{REF}$ by the voltage on the data bus.

The first and second secondary buffer circuits 12 and 15 are located between the data control circuit 6 and the corresponding first and second primary buffer circuits 11 and 14, respectively, so that the control signals from the data control circuit 6 on the first and second control lines 8 and 9 are buffered first through the corresponding one of the first and second secondary buffer circuits 12 and 15, and then through the corresponding one of the first and second primary buffer circuits 11 and 14 before being applied to the base 13 of the main bipolar transistor Q1 and the gate 10 of the main MOS transistor MN1. The first secondary buffer circuit 12 comprises a first and a second secondary buffer MOS transistor, namely, a first secondary buffer NMOS transistor MN8 and a second secondary buffer PMOS transistor MP9 which are coupled in series between the first rail 2 and the second rail 3 for powering the first secondary buffer circuit 12. The second secondary buffer circuit 15 comprises third and fourth secondary buffer MOS transistors, namely, a third secondary buffer NMOS transistor MN10 and a fourth secondary buffer PMOS transistor MP11, which are coupled in series between the first rail 2 and the second rail 3 for powering the second secondary buffer circuit 15.

The NMOS transistors of the first and second primary buffer circuits, namely, the first primary buffer NMOS transistor MN4 and the third primary buffer NMOS transistor MN6 are substrate diffusion isolated MOS transistors, each having an independently configurable back gate. The back gates of the respective first and third NMOS transistors MN4 and MN6 are connected to their corresponding sources, in order to avoid a parasitic diode (not shown) between the back gate and the source of each first and third primary buffer NMOS transistors MN4 and MN6 being forward biased when the voltage on the data output terminal 5 is pulled to the second state. Parasitic diodes $D_{pp4}$ and $D_{pp6}$ of the respective first and third primary buffer NMOS transistors MN4 and MN6 between the back gate and drain of each first and third primary buffer NMOS transistors MN4 and MN6 are reversed biased when the voltage on the data output terminal 5 is pulled to the second state, and thus, the first and second primary buffer NMOS transistors present a high impedance to the data output terminal 5 when the voltage on the data output terminal 5 is pulled to the second state.

The die areas of the main MOS transistor MN1 and the main bipolar transistor Q1 are selected to provide the main MOS transistor MN1 and the main bipolar transistor Q1 with respective on-resistances, which are sufficiently low so that the logic high and the logic low voltage states of the data output terminal 5, which are derived from the power supply voltage applied to the first and second rails 2 and 3, have a voltage swing, which is sufficient to comply with the transmission standard of the data bus.

In use, with the back gate 23 of the main MOS transistor MN1 coupled to the second rail 3, when data is to be outputted onto the data bus (not shown), the data control circuit 6 outputs the first and second control signals on the first and second control lines 8 and 9, respectively, which are coupled to the base 13 of the main bipolar transistor Q1 and the gate 10 of the main MOS transistor MN1, respectively, through the first and second primary and secondary buffer circuits 11, 12, 14 and 15 for selectively operating the main bipolar transistor Q1 and the main MOS transistor MN1 for determining the logic high and logic low voltage states of the data output terminal 5. The first signal is in a logic high state and the second signal is in a logic low state when the data output terminal 5 is to be pulled to the logic high state, and the first signal is a logic low state and the second signal is a logic high state when the data output terminal 5 is to be pulled to the logic low state. The third signal applied to the first and second control lines 8 and 9 by the data control circuit 6 is in the logic low state to disable, in other words, to operate the main bipolar transistor Q1 and the main MOS transistor MN1 in the off-state. The third signal in the logic low state is applied to the first and second lines 8 and 9 when the main bipolar transistor Q1 and the main MOS transistor MN1 are to be operated in the off-state either as a result of periods when data is not to be outputted through the data output terminal 5 or as a result of the voltage on the data output terminal 5 being pulled to the second state, namely, below the voltage reference $V_{REF}$.

While the voltage on the data output terminal 5 is in the first state, namely, above the voltage reference $V_{REF}$, the output signal from the comparator 30 operates the first and second control transistors MN2 and MN3, so that the back gate 23 of the main MOS transistor MN1 is coupled to the second rail 3 through the second control transistor MN3. In the event of the voltage on the data output terminal 5 being pulled to the second state, the output signal from the comparator 30 operates the first and second control transistors MN2 and MN3, so that the back gate 23 of the main MOS transistor MN1 is coupled through the first control transistor MN2 to the data output terminal 5. Additionally, the data control circuit 6 is responsive to the output signal from the comparator 30 which is inverted by the inverter 33 being indicative of the voltage on the data output terminal 5 being in the second state for outputting the third signal in the logic low state on the first and second control lines 8 and 9 for operating the main bipolar transistor Q1 and the main MOS transistor MN1 in the off-state, thereby preventing current being sourced from the first rail 2 through the main bipolar transistor Q1 and from the second rail 3 through the main MOS transistor MN1 to the data output terminal 5, and in turn to the data bus. Since the voltage on the base 13 of the main bipolar transistor Q1 and on the gate 10 of the main MOS transistor MN1 follows the voltage on the data output terminal 5, when the voltage on the data output terminal 5 is in the second state, neither the main bipolar transistor Q1 nor the main MOS transistor MN1 can be sufficiently forward biased to operate in the on-state, and thus remain in the off-state when the voltage on the data output terminal 5 is in the second state.

Furthermore, by virtue of the fact that the voltage on the back gate 23 of the main MOS transistor MN1 follows the voltage on the data output terminal 5, when the voltage on the data output terminal 5 is pulled to the second state, the base-emitter of the parasitic bipolar transistor $Q_{p1}$ of the main MOS transistor MN1 is prevented from being sufficiently forward biased to conduct current, and current is thus prevented from being sourced from the first rail 2 through the parasitic bipolar transistor $Q_{p1}$ to the data bus. Additionally, the parasitic diode $D_{p2}$ of the main MOS transistor MN1 is prevented from being sufficiently forward biased to conduct current, and thus is prevented from sourcing current from the interface circuit 1 to the data bus.

Therefore, when the voltage on the data output terminal 5 is pulled to the second state, the interface circuit 1 presents a high impedance to the data bus. The interface circuit 1 also presents a high impedance to the data bus when the voltage on the data output terminal is pulled to the second state and the interface circuit is powered down.

Additionally, when the data output terminal 5 is pulled to the second state, the first and second control transistors MN2 and MN3 present a high impedance to the data bus, as do the first and third primary buffer NMOS transistors MN4 and MN6 of the first and second primary buffer circuits 11 and 14, respectively.

If the voltage on the data output terminal 5 is pulled to a value between ground and the voltage reference $V_{REF}$ by the voltage on the data bus, while the voltage on the data output terminal 5 is between ground and the voltage reference $V_{REF}$, the parasitic bipolar transistor $Q_{p1}$ and the parasitic diode $D_{p2}$ of the main MOS transistor MN1 will be insufficiently forward biased to source current to the data bus, as will the relevant parasitic diodes of the first and second control transistor MN2 and MN3, and the first and third primary buffer NMOS transistors MN4 and MN6.

Thus, the interface circuit 1 provides a high impedance to the data bus in the event of the voltage on the data bus being pulled below the voltage reference $V_{REF}$, and being pulled between ground and the voltage reference $V_{REF}$, for all conditions of the interface circuit 1.

Additionally, should the voltage on the data bus pull the data output terminal 5 to a voltage above the supply voltage $V_{DD}$ on the first rail 2, the bipolar transistor Q1 will remain in the off-state, since its base-emitter will be reversed biased. The main MOS transistor MN1 will also remain in the off-state. The base-emitter of the parasitic bipolar transistor $Q_{p1}$ and the parasitic diode $D_{p2}$ of the main MOS transistor MN1 will also be reversed biased, when the voltage on the data output terminal 5 is above the supply voltage $V_{DD}$, and will not conduct current. Therefore, when the voltage on the data output terminal 5 is pulled above the supply voltage $V_{DD}$ the interface circuit 1 presents a high impedance to the data bus. Additionally, the interface circuit 1 presents a high impedance to the data bus when the interface circuit is powered down and the voltage on the data output terminal 5 is pulled above the supply voltage $V_{DD}$.

Accordingly, the interface circuit 1 also provides a high impedance to the data bus when the voltage on the data bus exceeds the positive voltage $V_{DD}$ on the first rail 2 of the supply voltage to the interface circuit 1 for all operating conditions of the interface circuit 1.

Therefore, the interface circuit 1 presents a high impedance to the data bus for all operating conditions of the interface circuit for all voltages on the data bus below the supply voltage ground and above the positive supply voltage $V_{DD}$. A summary of the operating conditions of the interface circuit showing the impedance presented to the data bus by the interface circuit for the different voltage states of the data output terminal 5 is set out in the table of FIG. 5.

Figure 1:
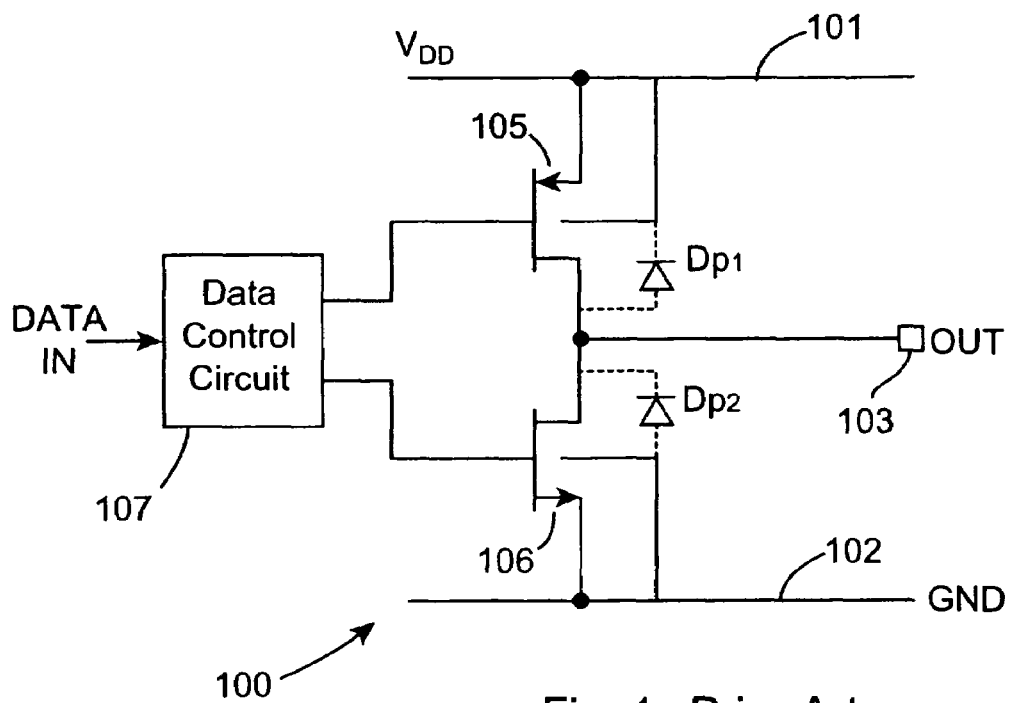
FIG. 1 is a circuit diagram of a prior art output stage interface circuit.
Figure 6:
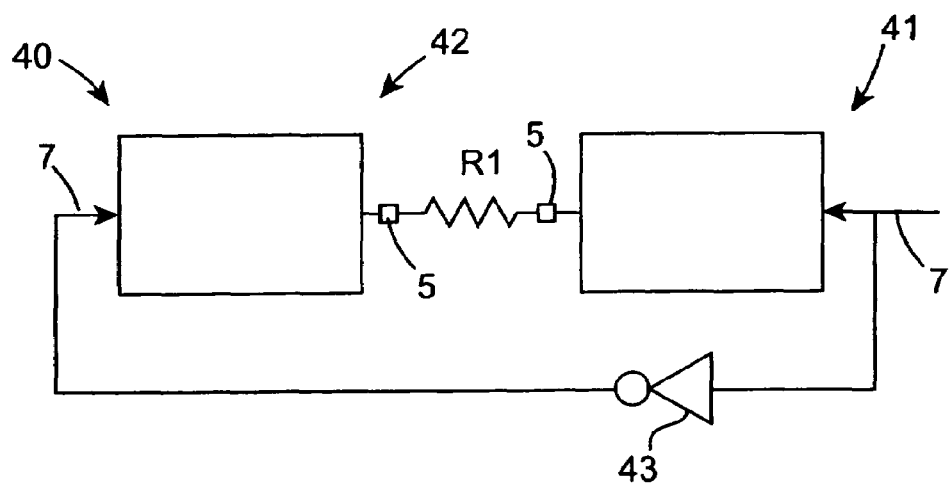
FIG. 6 is a block representation of an output stage interface circuit according to another embodiment of the invention.

Referring now to FIG. 6, there is illustrated a differential output stage interface circuit according to another embodiment of the invention, which is indicated generally by the reference numeral 40, for interfacing a digital data processing device (not shown) with a shared differential data bus represented by a resistor R1. The differential data bus may, for example, be a data bus operating to the RS485 transmission standard, for outputting digital data onto the differential data bus. The differential interface circuit 40 comprises two output stage interface circuits 41 and 42, which are illustrated in block representation only, but which are both identical to the output stage interface circuit 1. The data output terminals 5 of the interface circuits 41 and 42 are coupled to the respective lines of the differential data bus. The digital data input signal from the data processing device (not shown) is applied directly to the data input 7 of the data control circuit 6 of the interface circuit 41, and is applied to the data input 7 of the data control circuit 6 of the interface circuit 42 through an inverter 43 for inverting thereof. Otherwise, operation of the differential interface circuit 40 and the interface circuits 41 and 42 is similar to that already described with reference to the interface circuit 1.

While the interface circuit has been described with the high voltage of the power supply being applied to the first rail, and the low voltage of the power supply being applied to the second rail, it will be appreciated that the high voltage could be applied to the second rail, and the low voltage could be applied to the first rail, however, in such a case, the main MOS transistor would be replaced with a PMOS transistor, and the main bipolar transistor Q1 would be replaced with a PNP bipolar transistor. Additionally, the voltage reference which would be applied to the voltage reference terminal 31 of the comparator 30 would be selected to be of value above the high voltage $V_{DD}$ of the supply voltage applied to the second rail 3, but would be of such value that the difference between the value of the voltage reference and the high voltage $V_{DD}$ of the supply voltage would be less than a voltage which would be required to forward bias the parasitic components of the PMOS transistor coupled to the data output terminal into the low impedance state, in order to prevent current being sourced through those parasitic components from the data bus to the interface circuit, when the voltage on the data output terminal is pulled above the voltage reference.

Additionally, while the interface circuit has been described as being implemented by a BiCMOS process, the interface circuit may be implemented by any other suitable CMOS process, or indeed any other integrated circuit implementation process. It will also be appreciated that the interface circuit may be powered by a higher or a lower voltage supplies than a +3 volt supply.

While the interface circuit has been described with the second switch element being provided by a substrate isolated MOS device, and the isolation is obtained by diffusion isolation, in certain cases, it is envisaged that the second switch element may be provided by a substrate isolated MOS device where the isolation would be achieved by trench isolation. In other words, in such a case, the second switch element would be provided by a trench isolated MOS device. However, where the second switch element is provided by a trench isolated MOS device, it will be appreciated that the trench isolation would typically be formed by an oxide, or other dielectric material and thus coupling of the trench isolation to the first rail would not be required, since a parasitic diode would not exist between the P-well of the MOS device and the dielectric isolation or the N-well of the MOS device and the dielectric isolation, depending on whether the substrate isolated MOS device is an NMOS or a PMOS device.

While the control switch unit 25 has been described as being responsive to the output of the comparator 30 being indicative of the voltage on the data output terminal 5 being in the second state for coupling the back gate 23 of the main MOS transistor MN1 to the data output terminal 5, it will be readily apparent to those skilled in the art that any other suitable means or circuitry for detecting the voltage on the data output terminal being in the second state may be provided. Indeed, it will be appreciated that if the MOS transistors were ideal, the gate of the first control transistor MN2 could be coupled to the second rail, and the gate of the second control transistor MN3 could be coupled to the data output terminal 5, and the comparator could be dispensed with.

While the value of the voltage reference has been selected to be below the voltage on the second rail, in certain cases it is envisaged that the value of the voltage reference may be selected to be above the voltage on the second rail, even when the low voltage of the power supply is applied to the second rail. Although, in an ideal circuit the value of the voltage reference would be equal to the value of the voltage on the second rail.

It is also envisaged that the first switch element may be implemented by any other suitable type of switch element, for example when the second switch element is implemented as an NMOS device, the first switch element may be implemented as a PMOS device and vice versa.

While the first and second primary buffer circuits have been described as being coupled to the back gate of the main MOS transistor, so that they are selectively and alternately coupleable to the one of the second rail and the data output terminal through the control switch unit 25 simultaneously with the back gate of the main MOS transistor, the first and second primary buffer circuits may be selectively and alternately coupleable to the one of the second rail and the data output terminal through a separate switch unit, which would be responsive to the voltage on the data output terminal in similar fashion as the control switch unit is responsive to the voltage on the data output terminal.

The invention claimed is:

1. An output stage interface circuit for interfacing with a data bus, the interface circuit comprising:
   a first switch element coupled between a first rail and a data output terminal, the first rail being adapted for coupling to one of a high and a low voltage of a power supply, and the data output terminal being adapted for coupling to the data bus, the first switch element being responsive to a first control signal for selectively coupling the data output terminal to the first rail for determining one of a logic high state and a logic low state of the data output terminal during data output; and a second switch element coupled between a second rail and the data output terminal, the second rail being adapted for coupling to the other of the high and the low voltage of the power supply, the second switch element comprising a main MOS device having a gate for receiving a second control signal and being responsive to the second control signal for selectively coupling the data output terminal to the second rail for determining the other of the logic high state and the logic low state of the data output terminal during data output, the main MOS device having an independently configurable back gate selectively and alternately coupleable to one of the second rail and the data output terminal, the back gate of the main MOS device being coupled to the second rail in response to the voltage on the data output terminal being in a first state, and being coupled to the data output terminal in response to the voltage on the data output terminal being pulled by the voltage on the data bus to a second state from the first state across a voltage reference to lie to a side of the voltage reference opposite to that to which the voltage on the first rail lies for preventing current being conducted through parasitic components in the main MOS device coupled through the main MOS device to the data output terminal, thereby preventing current being sourced from one of the interface circuit and the data bus to the other of the interface circuit and the data bus through the said parasitic components in the main MOS device, and the gate of the main MOS device being coupleable to the data output terminal in response to the voltage on the data output terminal being pulled to the second state.

2. An interface circuit as claimed in claim 1 in which the value of the voltage reference is selected to be close to the voltage on the second rail.

3. An interface circuit as claimed in claim 1 in which the value of the voltage reference is selected so that the value of the voltage difference between the voltage reference and the voltage on the second rail is less than a value which if applied to the parasitic components in the main MOS device which are coupled to the data output terminal would be sufficient to forward bias the said parasitic components into a low impedance state.

4. An interface circuit as claimed in claim 1 in which the value of the voltage reference is selected to lie within 0.3 volts from the voltage on the second rail.

5. An interface circuit as claimed in claim 1 in which the value of the voltage reference is selected to be of a value which lies outside the operating voltage range defined by the power supply applied to the first and second rails and lies to the side of the operating voltage range adjacent the voltage on the second rail.

6. An interface circuit as claimed in claim 1 in which a control switch unit responsive to the state of the voltage on the data output terminal is provided for selectively and alternately coupling the back gate of the main MOS device to one of the second rail and the data output terminal.

7. An interface circuit as claimed in claim 6 in which the control switch unit comprises a first control switch coupled between the back gate and the data output terminal, and a second control switch coupled between the back gate and the second rail, the first and second control switches being responsive to the state of the voltage on the data output terminal.

8. An interface circuit as claimed in claim 7 in which the first and second control switches are provided by first and second MOS devices, respectively, each comprising an independently configurable back gate, and the back gate of each of the first and second MOS devices being coupled to one of the source and drain of the corresponding one of the first and second MOS devices for preventing parasitic components in the respective first and second MOS devices being sufficiently forward biased to conduct when the voltage on the data output terminal is pulled to the second state.

9. An interface circuit as claimed in claim 1 in which the second control signal is coupled to the gate of the main MOS device through a first primary buffer circuit, the first primary buffer circuit being selectively and alternately coupleable between the first rail and the second rail, and the first rail and the data output terminal for powering thereof, in response to the voltage on the data output terminal, and being coupled between the first rail and the data output terminal in response to the voltage on the data output terminal being in the second state.

10. An interface circuit as claimed in claim 9 in which the first primary buffer circuit comprises a first primary buffer MOS device for selectively coupling the gate of the main MOS device to the data output terminal, the first primary buffer MOS device having an independently configurable back gate coupled to one of a source and a drain of the first primary buffer MOS device for preventing parasitic components in the first primary buffer MOS device being sufficiently forward biased to conduct when the voltage on the data output terminal is pulled to the second state.

11. An interface circuit as claimed in claim 9 in which the first primary buffer circuit comprises a second primary buffer MOS device for selectively coupling the gate of the main MOS device to the first rail.

12. An interface circuit as claimed in claim 1 in which the first switch element comprises a control terminal for receiving the first control signal, the control terminal thereof being coupleable to the data output terminal in response to the voltage on the data output terminal being pulled to the second state.

13. An interface circuit as claimed in claim 12 in which the first control signal is coupled to the control terminal of the first switch element through a second primary buffer circuit, the second primary buffer circuit being selectively and alternately coupleable between the first rail and the second rail, and the first rail and the data output terminal for powering thereof, in response to the voltage on the data output terminal, and being coupled between the first rail and the data output terminal in response to the voltage on the data output terminal being in the second state.

14. An interface circuit as claimed in claim 13 in which the second primary buffer circuit comprises a third primary buffer MOS device for selectively coupling the control terminal of the first switch element to the data output terminal, the third primary buffer MOS device having an independently configurable back gate coupled to one of a source and drain of the third primary buffer MOS device for preventing parasitic components in the third primary buffer MOS device being sufficiently forward biased to conduct when the voltage on the data output terminal is pulled to the second state.

15. An interface circuit as claimed in claim 13 in which the second buffer circuit comprises a fourth primary buffer MOS device for selectively coupling the control terminal of the first switch element to the first rail.

16. An interface circuit as claimed in claim 1 in which a data control circuit is provided for converting a digital data signal from a digital data processing circuit to the first and second control signals.

17. An interface circuit as claimed in claim 16 in which the data control circuit is responsive to the voltage on the data output terminal being pulled to the second state for outputting a third control signal for coupling the control terminal of the first switch element and the gate of the main MOS device to the data output terminal.

18. An interface circuit as claimed in claim 1 in which a comparator is provided for comparing the voltage on the data output terminal with the voltage reference and for outputting a signal indicative of the state of the voltage on the data output terminal.

19. An interface circuit as claimed in claim 1 in which the main MOS device is a substrate isolated MOS device.

20. An interface circuit as claimed in claim 19 in which the main MOS device is diffusion isolated.

21. An interface circuit as claimed in claim 20 in which a diffusion well is provided extending around the main MOS device for isolating the main MOS device from the substrate in which the main MOS device is formed, and a buried diffusion layer extends beneath the main MOS device and co-operates with the diffusion well for isolating the main MOS device from the substrate in which the main MOS device is formed.

22. An interface circuit as claimed in claim 21 in which the diffusion well of the main MOS device is coupled to a voltage relative to the voltage on the second rail for preventing a parasitic diode between the diffusion well and the back gate being sufficiently forward biased to conduct current.

23. An interface circuit as claimed in claim 21 in which the diffusion well of the main MOS device is coupled to the first rail.

24. An interface circuit as claimed in claim 1 in which the voltage of the power supply applied to the first rail is higher than the voltage of the power supply applied to the second rail, and the main MOS device is an NMOS transistor.

25. An interface circuit as claimed in claim 1 in which the first switch element comprises a main bipolar transistor.

26. An interface circuit as claimed in claim 1 in which the interface circuit is implemented as an integrated circuit.

27. An interface circuit as claimed in claim 1 in which the interface circuit is implemented by a BiCMOS process.

28. A differential output stage interface circuit for interfacing with a differential data bus comprising:
  a pair of interface circuits, each having a first switch element coupled between a first rail and a data output terminal, the first rail being adapted for coupling to one of a high and a low voltage of a power supply, and the data output terminal being adapted for coupling to a corresponding one of a pair of differential lines of the data bus, the first switch element being responsive to a first control signal for selectively coupling the data output terminal to the first rail for determining one of a logic high state and a logic low state of the data output terminal during data output, and
  a second switch element coupled between a second rail and said data output terminal, the second rail being adapted for coupling to the other of the high and the low voltage of the power supply, the second switch element comprising a main MOS device having a gate for receiving a second control signal and being responsive to the second control signal for selectively coupling the data output terminal to the second rail for determining the other of the logic high state and the logic low state of the data output terminal during data output, the main MOS device having an independently configurable back gate selectively and alternately coupleable to one of the second rail and the data output terminal, the backgate of the main MOS device being coupled to the second rail in response to the voltage of the data output terminal being in a first state, and being coupled to the data output terminal in response to the voltage on the data output terminal being pulled by the voltage on the data bus to a second state from the first state across a voltage reference to lie to a side of the voltage reference opposite to that to which the voltage on the first rail lies for preventing current being conducted through parasitic components in the main MOS device coupled through the main MOS device to the data output terminal, thereby preventing current being sourced from one of the interface circuit and the data bus to the other of the interface circuit and the data bus through the said parasitic components in the main MOS device, and the gate of the main MOS device being coupleable to the data output terminal in response to the voltage on the data output terminal being pulled to the second state; and
  a data control circuit for each interface circuit, for converting a digital data signal to the first and second control signals for a corresponding interface circuit, a control circuit of one of said interface circuits being adapted for receiving a digital data signal directly from a digital data processing circuit, and a control circuit of the other of the interface circuits being adapted to receive the data signal from the data processing circuit through an inverter for inverting thereof.

29. A differential output stage interface circuit as claimed in claim 28 in which the interface circuits are adapted for interfacing with said differential data bus when said differential data bus operates under the RS485 transmission standard.

* * * * *